(12) United States Patent
Kuczynski

(10) Patent No.: US 7,479,590 B1
(45) Date of Patent: Jan. 20, 2009

(54) DRY ADHESIVES, METHODS OF MANUFACTURE THEREOF AND ARTICLES COMPRISING THE SAME

(75) Inventor: Joseph Kuczynski, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/968,951

(22) Filed: Jan. 3, 2008

(51) Int. Cl.
*D01F 9/12* (2006.01)
*H01J 1/02* (2006.01)

(52) U.S. Cl. .................. 977/707; 977/715; 977/720; 977/773; 977/775; 977/783; 423/447.1; 423/447.2; 313/309; 313/311

(58) Field of Classification Search .......... 428/209; 174/250–258; 977/742–752, 707, 715, 720, 977/773, 775, 783; 423/447.1, 447.2; 313/309, 313/311
See application file for complete search history.

(56) References Cited

U.S. PATENT DOCUMENTS

| | | | | |
|---|---|---|---|---|
| 6,232,706 B1 * | 5/2001 | Dai et al. | ..................... | 313/309 |
| 6,361,861 B2 * | 3/2002 | Gao et al. | ..................... | 428/367 |
| 6,383,923 B1 * | 5/2002 | Brown et al. | ................ | 438/666 |
| 6,436,221 B1 * | 8/2002 | Chang et al. | ................ | 156/247 |
| 6,739,932 B2 * | 5/2004 | Yaniv et al. | ..................... | 445/24 |
| 6,836,066 B1 * | 12/2004 | Lee et al. | ..................... | 313/497 |
| 6,913,075 B1 * | 7/2005 | Knowles et al. | ............. | 165/185 |
| 7,109,581 B2 | 9/2006 | Dangelo et al. | | |
| 7,132,161 B2 | 11/2006 | Knowles et al. | | |
| 7,147,534 B2 * | 12/2006 | Chen et al. | ..................... | 445/50 |
| 7,183,003 B2 * | 2/2007 | Leu et al. | ..................... | 428/408 |
| 7,205,940 B2 * | 4/2007 | Anazawa et al. | ...... | 343/700 MS |
| 7,253,442 B2 * | 8/2007 | Huang et al. | ................... | 257/77 |
| 7,262,075 B2 * | 8/2007 | Aggarwal et al. | ............ | 438/106 |
| 7,268,077 B2 * | 9/2007 | Hwang | ........................ | 438/680 |
| 7,291,396 B2 * | 11/2007 | Huang et al. | ................ | 428/408 |
| 7,294,397 B2 | 11/2007 | Jagota et al. | | |
| 7,312,531 B2 * | 12/2007 | Chang et al. | ................. | 257/770 |

(Continued)

FOREIGN PATENT DOCUMENTS

WO 2006094025 A2 9/2006

OTHER PUBLICATIONS

Hamed Arami et al. Polypyrrole/multiwall carbon nanotube nanocomposites electropolymerized on copper substrate; Feb. 15, 2007. ScienceDirect, Mateirals Letters 61 (2007) pp. 4412-4415.*
Zhao et al., "Interfacial energy and strength of multiwalled-carbon-nanotube-based dry adhesive" American Vacuum Society, Jan./Feb. 2006 B 24(1).

*Primary Examiner*—Cathy Lam
(74) *Attorney, Agent, or Firm*—Cantor Colburn LLP

(57) ABSTRACT

Disclosed herein is a printed circuit board comprising a laminate that comprises a copper foil; inorganic or metallic nanoparticles having an average diameter of less than 100 nanometers disposed on a surface of the copper foil; the nanoparticles being arranged in domains; the domains having average domain sizes of about 10 to about 100 nanometers and average interdomain spacings of 10 to about 1,000 nanometers; the nanoparticles not facilitating the transfer of an electrical current; a layer of solid organic polymer disposed on the nanoparticles; the layer of the organic polymer being bounded to the nanoparticles by van der Waals forces; the laminate being employed in a printed circuit board.

2 Claims, 1 Drawing Sheet

U.S. PATENT DOCUMENTS 7,335,603 B2 * 2/2008 Mancevski .................. 438/758
2003/0203139 A1 * 10/2003 Ren et al. .................. 428/34.3
2007/0116626 A1 * 5/2007 Pan et al. .................. 423/447.1
2007/0284986 A1 * 12/2007 Tai et al. .................... 313/309

* cited by examiner

DRY ADHESIVES, METHODS OF MANUFACTURE THEREOF AND ARTICLES COMPRISING THE SAME

BACKGROUND

This disclosure relates to dry adhesives, methods of manufacture thereof and articles comprising the same.

It is generally known that as signal line frequencies increase, a larger portion of the electrical signal propagates along the outer periphery of the conductor (a phenomenon known as the "skin effect"). Copper foils used in the fabrication of printed circuit boards are surface treated in order to enhance peel strength to the laminate as well as to passivate the highly reactive surface of the copper. Mechanical modification of the surface caused by the surface treatment results in increased surface roughness, which promotes signal loss at high frequencies. In addition, the chemical treatment of the surface causes the formation of less electrically conductive alloys on the surface of the copper foil, which generally causes increases in resistivity and additional signal losses. Therefore, from an electrical perspective, it is desirable to use the smoothest copper foil available.

Unfortunately, very smooth copper foils exhibit reduced peel strength when bonded to a polymeric material that is used in a laminate. In other words, the smooth copper foils can be easily detached from a layer of polymeric material thus causing destruction of the laminate. In an effort to address this concern, foil manufacturers employ a primer or B-staged polymeric polymer that is compatible with the low loss laminate matrix. However, no one primer is sufficient for every laminate matrix. For example, a primer utilized for a laminate that comprises an epoxy or epoxy/cyanate ester that has a high glass transition temperature is ineffective for use in laminates that comprise a polyphenylene ether. Consequently, a plurality of primers and associated additional processes are used for the various commercially available polymeric materials that are used to form laminates. Using a primer thus increases manufacturing cycle time and increases the cost of the laminate. It is therefore desirable to provide a single adhesive solution to the peel strength issue currently plaguing smooth copper foils.

SUMMARY

Disclosed herein is a printed circuit board comprising a laminate that comprises a copper foil; inorganic or metallic nanoparticles having an average particle size of less than or equal to about 100 nanometers disposed on a surface of the copper foil; the inorganic or metallic nanoparticles being arranged in domains; the domains having average domain sizes of about 10 to about 100 nanometers and average interdomain spacings of 10 to about 1,000 nanometers; the nanoparticles not facilitating the transfer of an electrical current; a layer of solid organic polymer disposed on the nanoparticles; the layer of the organic polymer being bounded to the nanoparticles by van der Waals forces; the laminate being employed in a printed circuit board.

Disclosed herein is a method of manufacturing a printed circuit board comprising disposing a mask having domains upon a copper foil; the domains having average domain sizes of about 10 to about 100 nanometers and average interdomain spacings of 10 to about 1,000 nanometers; the domains comprising openings that permit the deposition of a catalytic metal onto the copper foil; disposing a layer of catalytic metal upon the copper foil; the catalytic metal being disposed only in the domains; reacting the catalytic metal with a reactive gas to generate nanoparticles on a surface of the catalytic metal; the nanoparticles being inorganic or metallic an having average particle sizes that are less than or equal to about 100 nanometers; laminating a layer comprising an organic polymer with the copper foil; the van der Waals forces providing the only adhesive forces between the organic polymer and the metal particles disposed upon the copper foil; and using the laminate in a printed circuit board.

DETAILED DESCRIPTION

Figure 1:
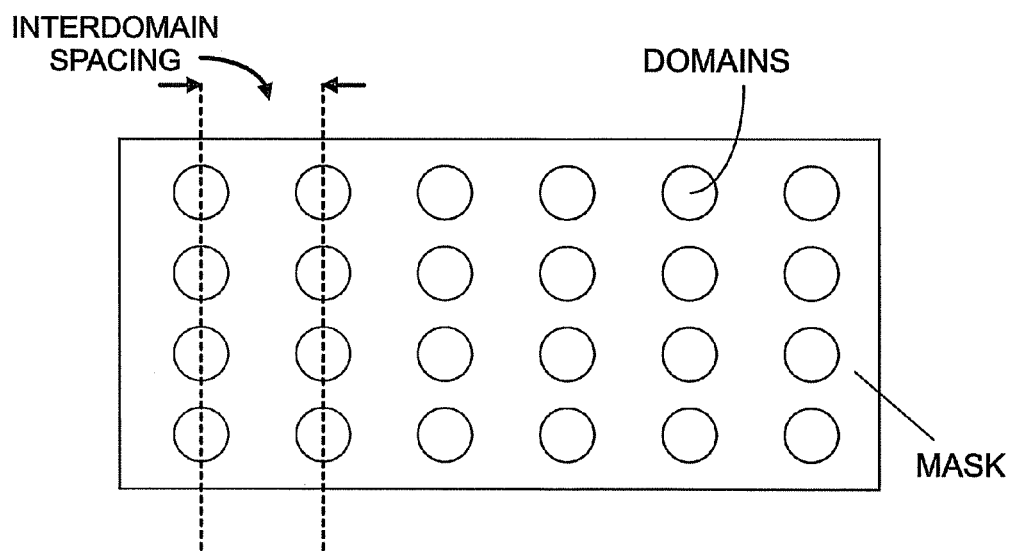
FIG. 1 depicts a mask having domains through which a reactive gas can contact the surface of the metal foil to grow the desired nanoparticles.

It will be understood that when an element is referred to as being "on" another element, it can be directly on the other element or intervening elements may be present therebetween. In contrast, when an element is referred to as being "disposed on" or "formed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. The use of the terms "first", "second", and the like do not imply any particular order, but are included to identify individual elements. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Disclosed herein is an article comprising a metal foil having disposed thereon a dry adhesive composition, the dry adhesive composition using van der Waals forces to advantageously promote the bonding of the metal foil to another proximate surface or object. In one embodiment, the article is a laminate, the metal foil is a copper foil and the dry adhesive layer comprises a plurality of nanoparticles. The nanoparticles can be nanorods, nanotubes, nanoonions, nanocoils, nanofibers, nanoribbons, or the like, or a combination comprising at least one of the foregoing nanoparticles. The nanoparticles present on the surface of the metal foil employ van der Waals forces to promote bonding to adjacent structures.

In an exemplary embodiment, the metal foil is a copper foil, while the nanoparticles are carbon nanotubes that are grown on the surface of the metal foil. The copper foil with the carbon nanotubes disposed thereon can be advantageously used in printed circuit boards where the van der Waals forces can be used to bond the copper foil to other polymeric layers without the use of primers. The metal foil with the nanoparticles disposed thereon is called a nanoparticle covered metal foil.

In one manner of proceeding, a metal foil is first produced by rolling or via electrodeposition. Rolled metal is made by successive cold rolling operations to reduce the thickness and extend the length of a billet of pure metal that is initially disposed between the rolls. The rolled metal is annealed to offset the work hardening that occurs during each rolling operation. Surface smoothness is dependent upon the finish imparted during the roll milling. Electrodeposited metal is manufactured by the electrodeposition of metal from a solution of a metal salt onto a slowly rotating steel drum. The electrodeposited metal foil is removed from the roll in a continuous coil. The side deposited against the drum has a smooth surface finish that is dependent upon the finish of the drum.

The metal foil can comprise copper, brass, steel, chromium, nickel, stainless steel, zinc, galvanneal/galvanized steel, or the like, or a combination comprising at least one of the foregoing metals. An exemplary metal foil is one that comprises copper.

Once the smooth metal foil is fabricated, nanoparticles are generally grown on one or both sides of the foil to form the nanoparticle covered metal foil. The nanoparticles enhance adhesion of the metal foil to the layers that surround it when it is disposed in a laminate.

The metal foil may then be used to grow nanoparticles. In one embodiment, in one method of growing the nanoparticles, a mask having nanosized or micrometer sized domains may be disposed upon the metal foil and the foil disposed in a reactive atmosphere at suitable elevated temperatures to produce the nanoparticles in those regions that are not protected by the mask. In this embodiment, no additional catalytic layers are disposed upon the metal foil when it is contacted with the reactive atmosphere at elevated temperatures. Exemplary masks can be manufactured from mesoporous silica. Mesoporous silica facilitates the growth of the nanoparticles such that the nanoparticles grow with their longitudinal axes perpendicular to the metal foil. The longitudinal axis is defined as being that which is parallel to the length of the nanoparticle.

In one embodiment, when the metal foil comprises copper, a mask having domain sizes of about 10 to about 500 nanometers, specifically about 20 to about 400 nanometers, and more specifically about 30 to about 100 nanometers is used to cover certain areas of the surface of the copper foil. No additional catalytic layers are disposed upon the copper foil. The copper foil thus covered by the mask is placed in a furnace and a gas that reacts with the copper is admitted into the furnace.

In one embodiment, the mask is manufactured from a material that can withstand the elevated temperatures of the furnace. It is generally desirable to use masks that have average interdomain spacings up to about 5,000 nanometers, specifically up to about 3,000 nanometers, and more specifically up to about 1,000 nanometers. In an exemplary embodiment, the masks have average domain sizes of about 30 to about 100 nanometers and average interdomain spacings of about 10 to about 1,000 nanometers.

The total surface area of the copper foil is up to about 10 square centimeters, specifically up to about 20 square centimeters, more specifically up to about 100 square centimeters, and more up to about 1,000 square centimeters.

An exemplary mask is depicted in the FIG. 1. The domains are those regions of the mask where the reactive gas can contact the metal to produce the nanoparticles. While the FIG. 1 shows a mask whose interdomain spacing are periodic, masks that have aperiodic interdomain spacings may be used as well.

The reactive gas generally comprises carbon-containing compounds. Suitable carbon-containing compounds are hydrocarbons, including aromatic hydrocarbons, e.g., benzene, toluene, xylene, cumene, ethylbenzene, naphthalene, phenanthrene, anthracene or the like, or a combination comprising at least one of the foregoing aromatic hydrocarbons; non-aromatic hydrocarbons, e.g., methane, ethane, propane, ethylene, propylene, acetylene, carbon tetrachloride, methylene chloride, or the like, or a combination comprising at least one of the foregoing non-aromatic hydrocarbons; and oxygen-containing hydrocarbons, e.g. formaldehyde, acetaldehyde, acetone, methanol, carbon monoxide, ethanol or mixtures thereof; or the like, or a combination comprising at least one of the foregoing oxygen-containing aromatic hydrocarbons.

When the metal foil comprises copper, without any additional catalytic coating, the carbon-containing compounds react with the copper to form polyacetylene nanoribbons. The carbon-containing compounds generally react with the copper at a temperature of about 150 to about 500° C., specifically about 200 to about 450° C., and more specifically about 250 to about 400° C.

The nanoribbons generally have aspect ratios of about 5 to about 1000, specifically about 8 to about 500, and more specifically about 10 to about 100. Upon being removed from the furnace, the mask is removed and the copper foil with the nanoribbons disposed thereon can be used in a laminate as will be described below.

In an exemplary embodiment, copper nanorods may be produced on the surface of the copper foil by electrodeposition through a porous anodic alumina membrane. The porous alumina membrane is subsequently dissolved leaving the copper nanorods on the copper foil. This method of producing copper nanorods on a copper foil is disclosed by Taberna et al. in an article titled "High Rate Capabilities $Fe_3O_4$-based Cu Nano-Architectured Electrodes For Lithium-ion Battery Applications", Nature Materials, Vol. 15, July 2006, pages 567-573, the entire contents of which are hereby incorporated by reference. The copper rods developed using the aforementioned reference may be appropriately treated to remove a layer of copper oxide disposed thereon.

Nanotube and nanorods synthesis on the surface of the metal foil can also be accomplished by high frequency electric discharge assisted mechanical milling as disclosed by A. Calka et al. in "Nanotube and Nanorod Synthesis under High Frequency Electric Discharge Assisted Mechanical Milling" in Solid State Phenomena Vol. 114 (2006), pages 277-283.

The copper nanorods generally have diameters of about 10 to about 100 nanometers, specifically about 20 to about 80 nanometers. The copper nanorods generally have aspect ratios of about 5 to about 1000, specifically about 8 to about 500, and more specifically about 10 to about 100. Upon being removed from the electrolytic bath, the mask is removed and the copper foil with the nanorods disposed thereon can be used in a laminate as will be described below.

In another embodiment, either a catalytic metal layer or a catalyst layer comprising metal encapsulated macromolecules is disposed on one or both sides of the metal foil. The catalytic metal layer generally comprises a transition metal that is deposited on the metal via techniques such as chemical vapor deposition (CVD), expanding thermal plasma (ETP), ion plating, plasma enhanced chemical vapor deposition (PECVD), metal organic chemical vapor deposition (MOCVD) (also called organometallic chemical vapor deposition (OMCVD)), metal organic vapor phase epitaxy (MOVPE), physical vapor deposition processes such as sputtering, reactive electron beam (e-beam) deposition, and plasma spray. Exemplary processes are CVD and PECVD.

The catalytic metal layer generally comprises transition metals such as iron, cobalt, and/or nickel; or platinum group metals such as ruthenium, osmium, rhodium, iridium, palladium, and/or platinum; other metals such as silver, gold, copper, aluminum, or the like, or a combination comprising at least one of the foregoing catalytic metals. The catalytic metal layer generally has a thickness of about 20 to about 200 nanometers. An exemplary thickness is about 100 nanometers.

The catalyst layer comprises a metal encapsulated macromolecule, wherein the metal is selected from the group consisting of titanium, vanadium, chromium, manganese, iron, cobalt, nickel, copper, molybdenum, tungsten, or the like, or a combination comprising at least one of the foregoing metals. In an exemplary embodiment, the catalyst comprises a metal encapsulated dendrimer molecule. Exemplary dendrimer molecules include those that are amine functional, so that the metal is chelated, coordinated, encapsulated, or otherwise contained on the exterior or in the interior of the dendrimer molecule.

Following the deposition of the catalytic metal layer or the catalyst layer, the mask having nanosized or micrometer sized interdomain spacings is disposed on the foil. As discussed above, the foil is then disposed in a reactive atmosphere at elevated temperatures to produce the nanoparticles in those regions that are not protected by the mask.

The metal foils can have nanoparticles disposed on only a single surface or on both opposing surfaces if desired. In addition, the nanoparticles may be disposed on only a portion of a single surface of the metal foil. When the catalytic layer comprises a transition metal or a platinum group metal, the metal foil is reacted with the reactive gas at a temperature of about 450 to about 1,200° C., specifically about 500 to about 1,000° C. and more specifically about 550 to about 900° C.

When the catalytic layer comprises a transition metal or a platinum group metal, the nanoparticles comprise carbon nanotubes. Carbon nanotubes may be single wall carbon nanotubes (SWNTs), multiwall carbon nanotubes (MWNTs), or vapor grown carbon fibers (VGCF).

These SWNTs generally have a single wall comprising a graphene sheet with outer diameters of about 0.7 to about 2.4 nanometers (nm). MWNTs have at least two graphene layers bound around an inner hollow core. MWNTs generally have diameters of about 2 to about 50 nm. VGCF or partially graphitic carbon fibers having diameters of about 3.5 to about 100 nanometers (nm) and an aspect ratio greater than or equal to about 5 may also be used. When carbon nanotubes are used, it is desirable to have an average aspect ratio greater than or equal to about 5, specifically greater than or equal to about 100, and more specifically greater than or equal to about 1,000. The carbon nanotubes may be functionalized if desired.

Figure 2:
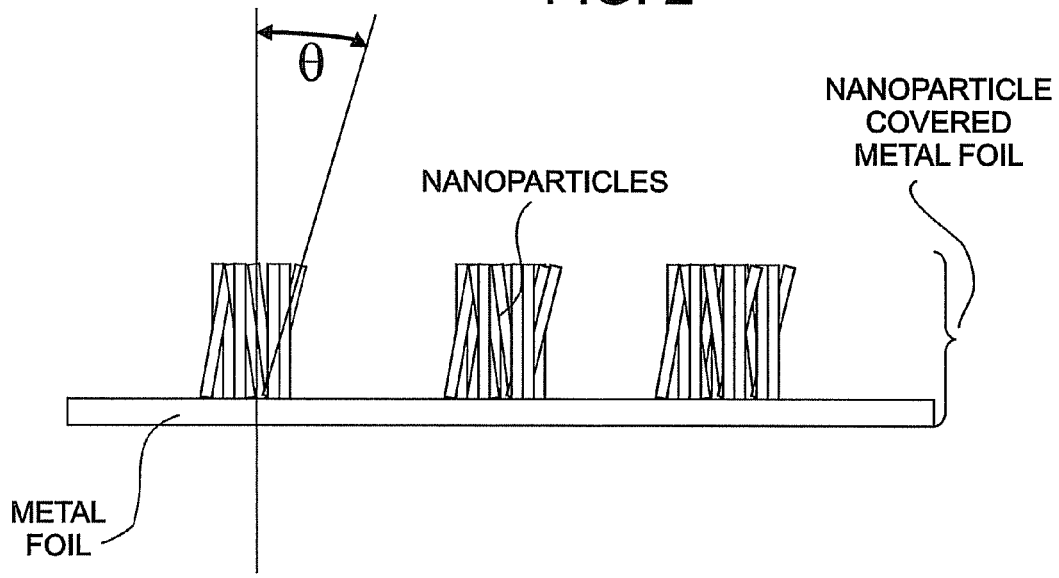
FIG. 2 is a side view of the metal foil with the nanoparticles disposed thereon.

The nanoparticles are disposed upon the metal foil such that the average inclination of their longitudinal axis is disposed at an angle θ of up to about 25 degrees, specifically up to about 20 degrees, and more specifically up to about 15 degrees from the normal drawn to the metal foil. This is depicted in the FIG. 2. It is to be noted that the nanoparticles do not facilitate the transfer of an electrical current, but only facilitate adhesion between the metal foil and an opposing organic polymeric surface.

After the nanoparticle covered metal foil is formed it may be disposed in a laminate. In one embodiment, the laminate can comprise a plurality of metal foils, each of which have nanoparticles disposed thereon.

The laminate generally comprises organic polymeric layers in addition to the nanoparticles covered metal foil.

The organic polymer used in the polymeric layers may be selected from a wide variety of thermoplastic polymers, thermosetting polymers, blend of thermoplastic polymers, or blends of thermoplastic polymers with thermosetting polymers. The organic polymer may also be a blend of polymers, copolymers, terpolymers, or combinations comprising at least one of the foregoing organic polymers. Examples of the organic polymer are polyacetals, polyolefins, polyacrylics, polycarbonates, polystyrenes, polyesters, polyphenylene oxides, polyamides, polyamideimides, polyarylates, polyarylsulfones, polyethersulfones, polyphenylene sulfides, polyvinyl chlorides, polysulfones, polyimides, polyetherimides, polytetrafluoroethylenes, polyetherketones, polyether etherketones, polyether ketone ketones, polybenzoxazoles, polyvinyl ethers, polyvinyl thioethers, polyvinyl alcohols, polyvinyl ketones, polyvinyl halides, polyvinyl nitriles, polyvinyl esters, or the like, or a combination comprising at least one of the foregoing organic polymers.

Examples of thermosetting organic polymers include cyanate ester, polyurethane, natural rubber, synthetic rubber, epoxy, phenolic, polyesters, polyamides, silicones, or the like, or combinations comprising at least one of the foregoing thermosetting polymers. Blends of thermosetting polymers as well as blends of thermoplastic polymers with thermosets can be utilized.

Laminates comprising the nanoparticle covered metal foils can be manufactured by molding the nanoparticle covered metal foils between layers of an organic polymer. van der Waals forces provide adhesion between the nanoparticles and the layers of the organic polymer in a manner similar to that between the setae on a gecko's feet and the surface of a wall. Laminates can also be manufactured by injection molding, compression molding, co-extrusion, roll milling, and/or vacuum forming.

Laminates can also be manufactured by coating a layer of the organic polymer on the nanoparticle covered metal foils. Examples of coating are dip coating, spin coating, spray painting, electrostatic painting, and the like. The laminate can further comprise a second layer of organic polymer disposed on a surface of the foil that is opposed to the surface that contains the nanoparticles.

The laminates manufactured by this method can be advantageously used for manufacturing printed circuit boards. The nanoparticle covered metal foils are advantageous in that they provide a new way to manufacture laminates while avoiding the use of primers.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention.

What is claimed is:

1. A printed circuit board comprising:
   a laminate that comprises:
      a copper foil;

nanoparticles having diameters of less than or equal to about 100 nanometers disposed on a surface of the copper foil; the nanoparticles being arranged in domains; the domains having average domain sizes of about 10 to about 100 nanometers and average inter-domain spacings of 10 to about 1,000 nanometers; the nanoparticles not facilitating the transfer of an electrical current, wherein the nanoparticles are nanorods, nanoribbons, carbon nanotubes, or a combination comprising at least one of the foregoing nanoparticles;

a first layer of solid organic polymer disposed on the nanoparticles; the layer of the organic polymer being bounded to the nanoparticles by van der Waals forces; the laminate being employed in a printed circuit board; and a second layer of organic polymer disposed on a surface of the copper foil that is opposed to the surface containing the nanoparticles.

2. The printed circuit board of claim 1, wherein the nanoparticles are disposed on the surface of the copper foil with the average direction of their longitudinal axis being substantially perpendicular to the surface of the copper foil.

* * * * *